United States Patent [19]

Gordon et al.

[11] Patent Number: 5,009,607

[45] Date of Patent: Apr. 23, 1991

[54] FLEXIBLE CIRCUIT CONNECTOR

[75] Inventors: Herman B. Gordon, Phoenix, Ariz.; Mark J. Owens, Vernon, Conn.; Leon Rubinstein, Natick, Mass.; Scott Simpson, Woodstock, Conn.

[73] Assignee: Rogers Corporation, Rogers, Conn.

[21] Appl. No.: 384,269

[22] Filed: Jul. 24, 1989

[51] Int. Cl.[5] .................... H05K 1/00

[52] U.S. Cl. .................... 439/67; 439/77; 439/496

[58] Field of Search .................... 439/55, 67, 77, 80–83, 439/492–499

[56] References Cited

U.S. PATENT DOCUMENTS 4,509,811 4/1985 Amano .................... 439/77

4,717,345 1/1988 Gordon et al. .................... 439/496

FOREIGN PATENT DOCUMENTS 1180027 2/1970 United Kingdom .................... 439/77

2134331 8/1984 United Kingdom .................... 439/496

*Primary Examiner*—David L. Pirlot

*Attorney, Agent, or Firm*—Fishman, Dionne & Cantor

[57] ABSTRACT

A flexible circuit connector is presented which is used to electrically and mechanically connect a flexible circuit to a circuit board or other electronic device. The connector also functions to wipe off any residue or debris on the electrical contacts before final connection. The connector is comprised of a male plug and a female adapter. The male plug comprises two interlocking pieces including a block and a cover. These two pieces allow for easy assembly and disassembly of the plug in conjunction with a flexible circuit. The female adapter comprises a hood which may be fastened directly to a circuit board. Alternatively, the hood may be fastened to a base plate which has gold plated contacts and conductive pins which pass through and which are soldered to the circuit board.

37 Claims, 4 Drawing Sheets

FLEXIBLE CIRCUIT CONNECTOR

BACKGROUND OF THE INVENTION

This invention relates to a method and apparatus for interconnecting electrical circuit elements. More particularly, this invention relates to a new and improved electrical connector and method of using the same for establishing electrical contact between a flexible circuit and another circuit device utilizing relative motion therebetween to wipe away any debris or other foreign matter (i.e., oxide films) which may adversely affect electrical contact.

Conventional methods of interconnecting electrical or electronic circuit components consist of the use of separate connector structures and/or soldering terminals on the components to conductors which deliver current to or from the components. With regard to the special case of flexible circuits, well known standard pin and socket connectors are typically employed to interconnect such flexible circuits to other electronic circuit components. While generally suitable for their intended purpose, standard pin and socket connectors do suffer from certain drawbacks and deficiencies. For example, standard pin and socket connectors typically do not provide adequate electrical performance, particularly for high speed electronic applications. In addition, standard pin and socket connectors often have a relatively complicated physical structure leading to high manufacturing costs, as well as a relatively large size leading to an undesirably high profile and an undesirable requirement for large circuit board area.

In some applications it has been found desirable to replace the use of standard pin and socket connectors as a technique for use in establishing connections to flexible and other circuits. In these applications, the requisite electrical contact may be established by mechanically pressing the terminal portions of the circuit against terminal pads on the connector, device or another circuit. Such prior art pressure connections are customarily made with the aid of a resilient pressure applicator, such as an elastomeric member, which is placed in compression to bias at least one of the components to be electrically interconnected toward the other component to hold the terminal portions thereof in electrical contract. Such a solderless connection system is disclosed in U.S. Pat. No. 4,468,074 assigned to the assignee hereof and incorporated herein by reference.

U.S. Pat. No. 4,468,074 discloses an apparatus wherein contact portions of a first array of conductive elements are urged against mating contacts of a second array of conductive elements by a pressure applicator comprising a resilient cellular plastic material thereby establishing and maintaining an electrical connection therebetween. The use of such a cellular resilient material permits a plurality of closely spaced exposed electrical conductors on or extending from a pair of substrates to be aligned and thereafter reliably pressed together, with the electrical connections being established by a requisite contact pressure applied to the substrates. The solderless connector of U.S. Pat. No. 4,468,074 may be employed to interconnect flexible circuits; to connect flexible circuits to circuits on rigid substrates; to establish connections between the leads extending from an integrated circuit in a circuit pattern on a flexible or rigid circuit board; and in other applications.

It is well known that conventional electrical connector devices, such as the male/female type, utilize mutual or relative sliding motion during the connecting process. This relative motion between the cooperating male and female connectors is desirable as it acts to "wipe" away any debris or foreign matter on the connectors. Such debris may adversely effect electrical contact. While suitable for its intended purposes, the solderless connector or U.S. Pat. No. 4,468,074 will not necessarily provide such relative motion between the flexible circuit and other circuit devices which are to be interconnected. This is because the circuit devices are interconnected when one device is brought down and disposed on another device thereby precluding any lateral movement which would act to wipe away undesirable foreign matter. Consequently, dirt debris and other foreign matter may still be present on the respective electrical contacts subsequent to interconnection which may lead to unreliable contacting.

Another area of concern with "non-wiping" solderless connectors of the type disclosed in U.S. Pat. No. 4,468,074 is the open aging of the circuits before assembly. During exposure to the normal levels of corrosive gases common in air, the metal contact surfaces can corrode, reducing the electrical performance when assembled. As mentioned hereinabove, a typical method for improving the performance of connectors is to provide for a sliding motion between the contacts as they are mated. This sliding action breaks through the non-conductive corrosion layers that may have formed and thus improves the electrical performance of the connector.

U.S. Pat. No. 4,717,345, which is assigned to the assignee hereof, discloses several embodiments of a solderless connector that effectively "wipes" away any debris or foreign matter on the connector contacts. A male/female connector assembly is depicted in FIGS. 2–5 of U.S. Pat. No. 4,717,345. Unfortunately, this particular connector assembly suffers from certain drawbacks and deficiences. For example, the connector of FIGS. 2–5 is difficult to assemble and disassemble, lacking precise and easy means for connecting the flexible circuit to the male insert portion.

Still other prior art solderless connectors are disclosed in U.S. Pat. Nos. 4,647,125; 4,655,524; 4,744,764 and 4,768,971.

SUMMARY OF THE INVENTION

The above discussed and other problems and disadvantages of the prior art are overcome or alleviated by the electrical connection technique and apparatus of the present invention. In accordance with the present invention, an electrical connector is provided for establishing electrical contact between a flexible circuit and another circuit device utilizing relative motion therebetween to wipe away or remove any debris or other foreign matter present on the terminals which could adversely effect electrical contact. The solderless connector of the present invention comprises a male plug which is easily and quickly detachably assembled onto a flexible circuit. The present invention also includes a female adapter which engages and locks onto the male plug during use.

The male member comprises two parts, a lower block and a cover. The lower block has (on the side which contacts the circuit board) spaced locator pins for alignment and registration of the flexible circuit. Adjacent to the locator pins is a recess for receiving a resilient pressure applicator such as an open or closed cell foam. The pressure applicator produces the necessary contact force between the electrical contacts of the board and the flexible circuit to provide adequate residue removal during insertion of the plug, and adequate electrical contact during use.

To assemble the male connector, the flex circuit is wrapped completely around the lower block so that when mated with the cover, the "free" end of the flex circuit is trapped between the lower block and the cover. Short pins (about the thickness of the flex circuit) on the lower block oppose attachment holes on the flex circuit to assure that the "free" end of the flex circuit does not pull out of the completed assembly. Tabs on the front of the lower block are then inserted into openings in the cover and the cover is pivoted downward onto the flex circuit/lower block sub assembly and snapped into place. Additional locator pins on the lower block (on the same side as the short flex attachment pins), help align the flex circuit/block subassembly to the cover. Both these pins and the flex locator pins allow for good positional tolerance of the flex contact pads to the board. This design improves overall tolerances which results in a higher quality product. The ease of assembly also results in a decrease in manufacturing costs.

In a preferred embodiment of the present invention, a base plate having a plurality of gold plated conductors is used in conjunction with a hood to define the female adapter. This base plate permits the connector of the present invention to be used in conjunction with a circuit board which is free of gold plating (because the gold plating is present on the conductors mounted within the discrete base plate). This result leads to reduced manufacturing costs and comprises an important feature of the present invention.

The above-discussed and other features and advantages of the present invention will be apparent to and understood by those skilled in the art from the following detailed description and drawings.

BRIEF DESCRIPTION OF THE FIGURES

Referring now to the drawings, wherein like elements are numbered alike in the several FIGURES.

DESCRIPTION OF THE INVENTION

Figure 1:
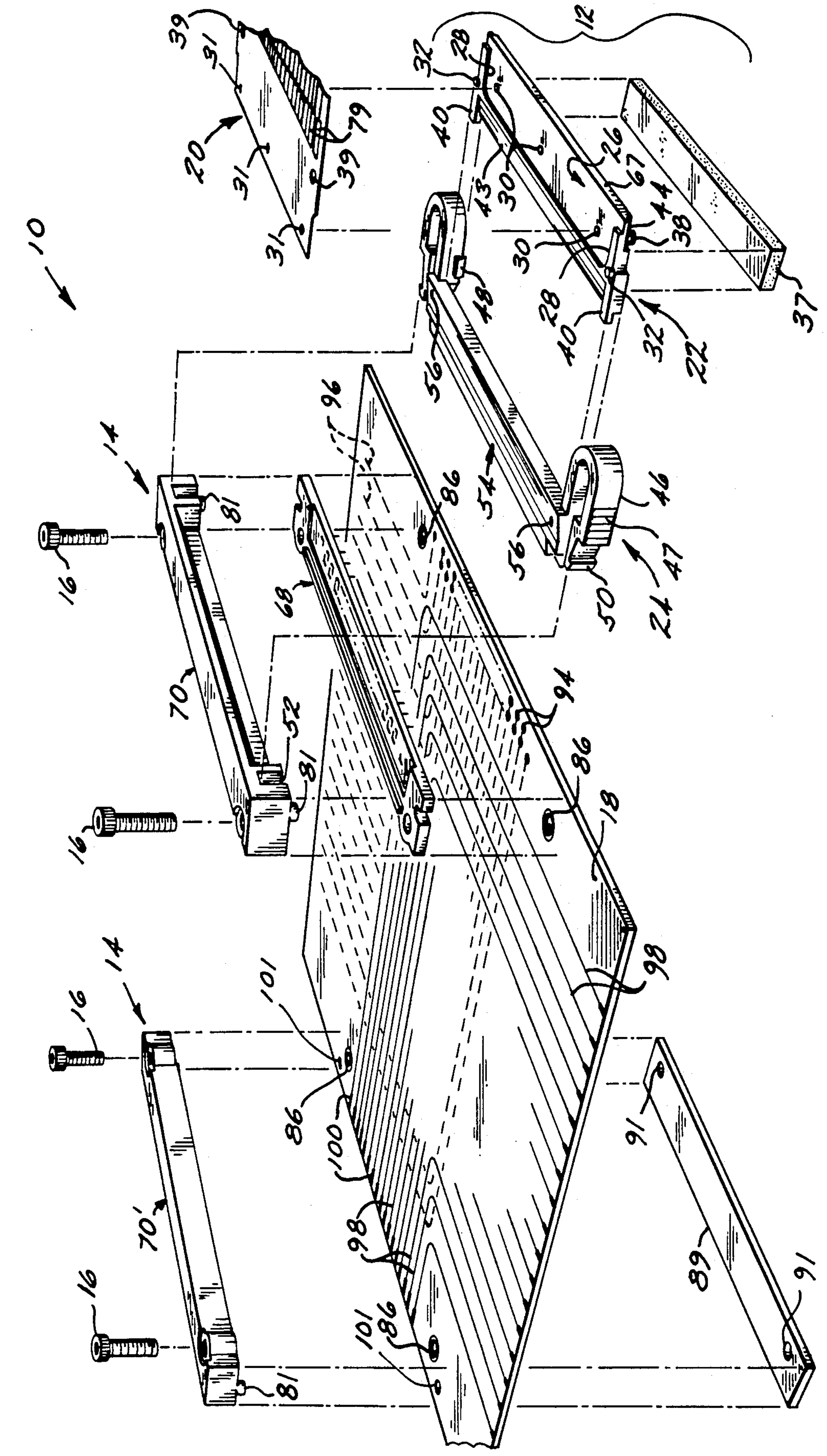
FIG. 1 is an exploded perspective view of the solderless connector of the present invention.
Figure 3:
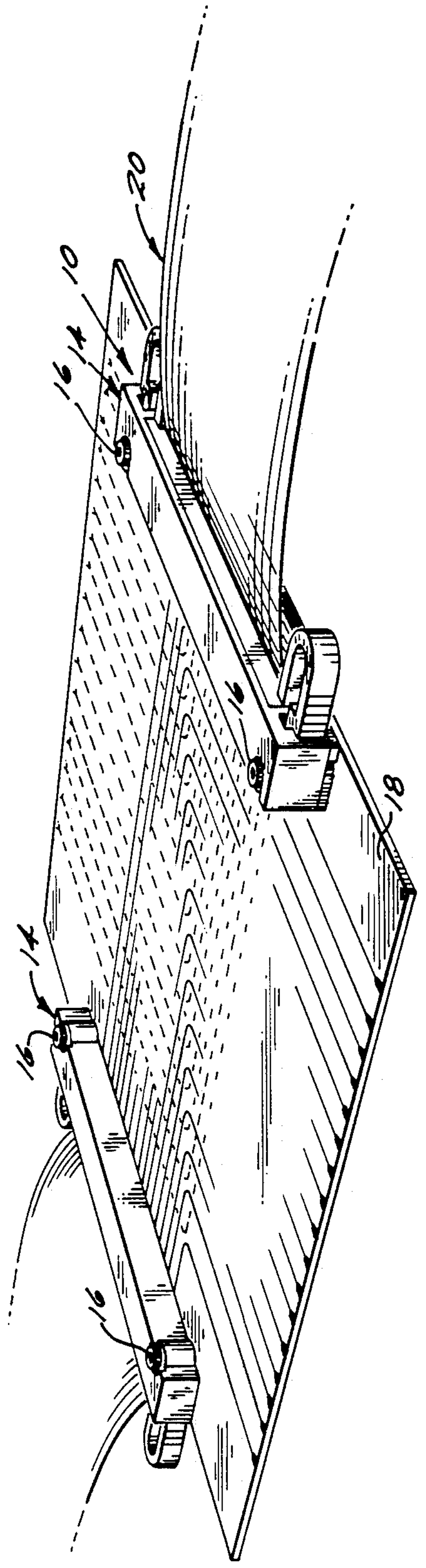
FIG. 3 is a fully assembled perspective view of the connector of FIG. 1.
Figure 2:
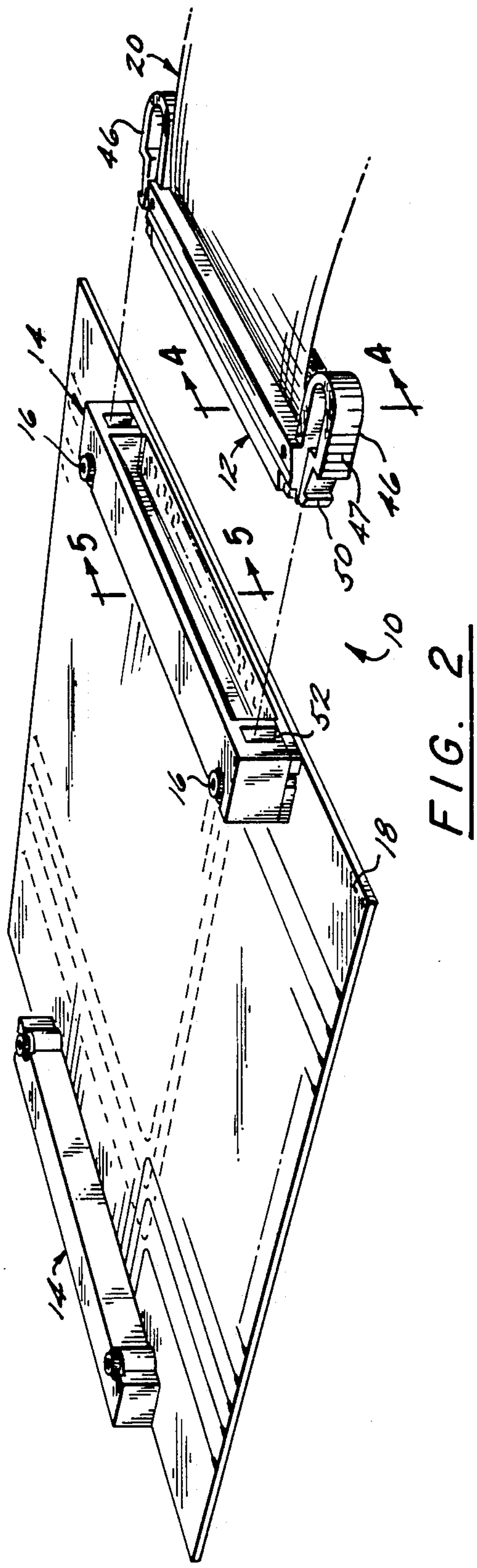
FIG. 2 is a partially assembled perspective view of the connector of FIG. 1.
Figure 4:
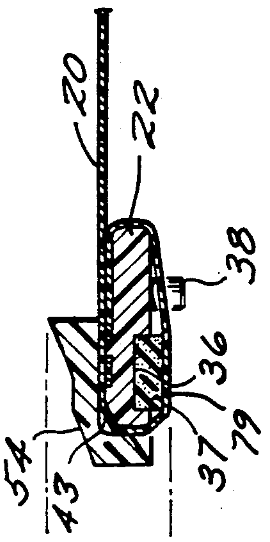
FIG. 4 is a cross-sectional elevation view along the line 4—4 of FIG. 2.

Referring first to FIGS. 1–3, a solderless connector in accordance with the present invention is shown generally at 10. Connector 10 is comprised of a male plug 12 which is inserted into a female adapter 14. Female adapter 14 is connected by threaded fastening means 16 to the edge of a rigid circuit board 18. Plug 12 is interconnected to a flex circuit 20. As will be discussed in more detail hereinafter, when plug 12 is inserted into adapter 14, an electrical connection is created between the flex circuit 20 and the circuit board 18.

Figure 9:
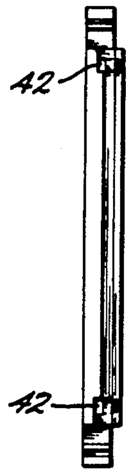
FIG. 9 is a front elevation view of the cover portion of the male plug used in the connector of the present invention.
Figure 10:
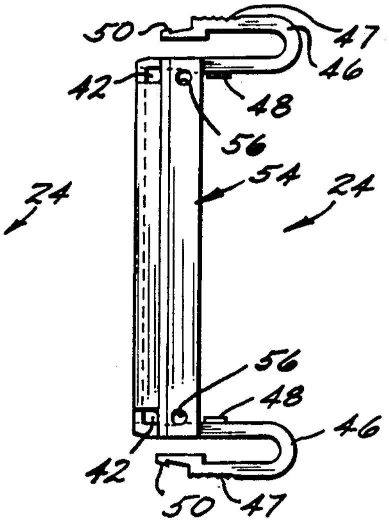
FIG. 10 is a top plan view of the cover of FIG. 9.
Figure 8:
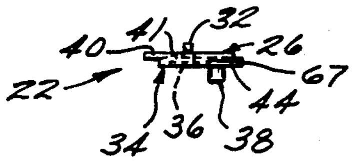
FIG. 8 is an end view of the lower block of FIG. 6.
Figure 11:
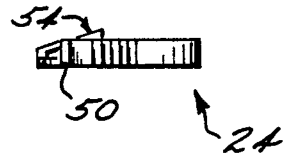
FIG. 11 is an end view of the cover of FIG. 9.
Figure 15:
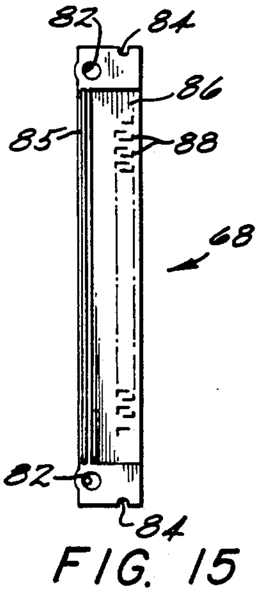
FIG. 15 is a top plan view of the base plate for the female hood used in the connector of the present invention.
Figure 16:
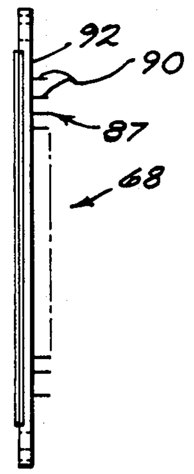
FIG. 16 is a side elevation view of the base plate of FIG. 15.

Referring now to FIGS. 1–4 and 6–11, the components of male plug 12 will now be described in greater detail. Plug 12 is comprised of two elements including a lower block 22 (FIGS. 6–8) and a cover 24 (FIGS. 9–11). Block 22 is generally rectangular in shape. Block 22 has an upper surface 26 (the surface which is covered by cover 24) which includes a rectangular inset 28. Inset 28 has a plurality of spaced, aligned attachment pins 30 extending upwardly therefrom which are sized and spaced to be received by corresponding openings 31 in flexible circuit 20. Similarly, inset 28 is sized to receive flexible circuit 20 therein and has a depth approximately equal to the thickness of the flexible circuit. Pins 30 act to attach the "free" end of flexible circuit 20 during assembly of plug 12. Surface 26 also includes a pair of spaced guide lugs 32. Lugs 32 function to align and guide cover 24 into engagement with block 22.

Block 22 has a lower surface 34 which is located on the opposite side of block 22 from upper surface 26. Lower surface 34 includes a rectangular recess 36 which holds a resilient pressure applicator 37 (shown in FIG. 1 and 4). Also located on surface 34 are a pair of spaced locator posts 38 which are sized and spaced to receive a pair of corresponding openings 39 in flexible circuit 20 when circuit 20 is wrapped about block 22 and engaged to cover 14.

Each end surface 41 of block 22 includes a tab 40 which extends outwardly from the front edge of block 22. Tabs 40 are inserted into corresponding openings 42 in cover 24. Each end surface 41 of block 22 also includes a stepped-in portion having a small shoulder 44 which is intended to effect snap-lock engagement with a corresponding shoulder in cover 24 as will be described hereinafter. Located between tabs 40 on block 22 is a ramped front edge 43.

Turning now to FIGS. 1–4 and 9–11, cover 24 includes a main cover section 54 which is generally rectangular in shape and has a ramped profile. Main cover section 54 includes previously mentioned openings 42 at opposed corners for receiving tabs 40 of block 22. Another pair of spaced apertures 56 extend through main cover section 54 for mating with lugs 32 and thereby providing alignment between cover 24 and block 22.

A u-shaped resilient locking arm 46 is located at each end of main body section 54. Locking arms 46 are used both for retaining plug 12 in adapter 14 and for locking block 22 into cover 24. The interior surface of each arm 46 includes a shoulder 48 which is sized and positioned to effect snap-lock engagement to shoulder 44 on block 22.

Figure 12:
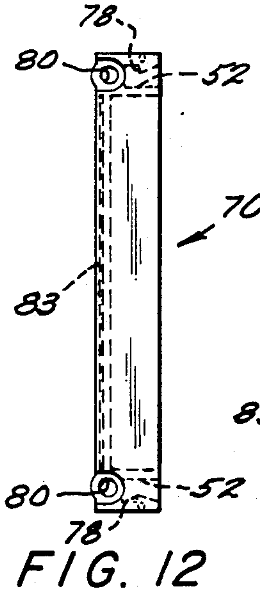
FIG. 12 is a top plan view of the female hood of the present invention.
Figure 13:
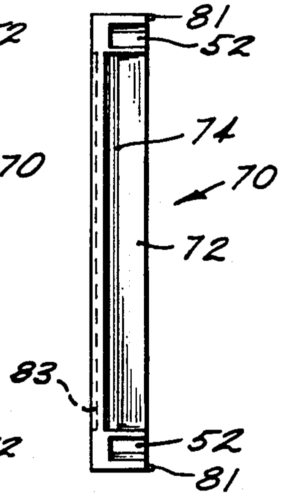
FIG. 13 is a side elevation view of the hood of FIG. 12.
Figure 17:
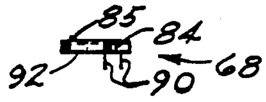
FIG. 17 is an end view of the base plate of FIG. 15.
Figure 14:
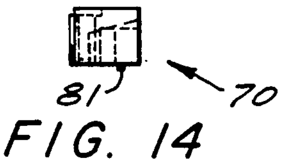
FIG. 14 is an end view of the hood of FIG. 12.

U-shaped arms 46 each terminate at a hook 50 which snap-locks into a matched opening 52 (shown in FIG. 12) of female adapter 14. Finger grip corrugations 47 are provided on the exterior surface of arms 46 to permit ease of manipulation by the user.

With reference to FIGS. 1–4, the method of assembling flex circuit 20 to male plug 12 will now be described. First flexible circuit 20 is placed over locator posts 38 on surface 34, providing primary alignment and registration. The end of flex circuit 20 is then wrapped around end 67 of block 22 and holes 31 of flex circuit 20 engage pins 30 of inset 28, facilitating the strain relief features of this connector. It will be appreciated that an adhesive may be used in place of registration pins 30 to align and hold flex circuit 20 in place. An adhesive may also be used in conjunction with registration pins 30. Prior to assembly of flex circuit 20 onto plug 12, resilient foam applicator 37 is placed into and preferably adhered to recess 36 of block 22.

Next, flex circuit 20 is wrapped over ramped edge 43 between tabs 40 and back onto surface 26. At this point a complete loop of flex circuit 20 exists, with block 22 located in the center of the loop. It will be appreciated that by placement of flex circuit 20 over locator pins 38, circuit 20 will not be free to move along the length of block 22.

Upon completion of the wrapping of flex circuit 20 around block 22, cover 24 is ready for placement. Tabs 40 of block 22 are inserted into openings 42 of cover 24. Cover 24 is then pivoted down onto block 22 until shoulders 48 on arms 46 of cover 24 mate with shoulders 44 on the ends 41 of block 22. Simultaneously, guide lugs 32 will engage with corresponding openings 56 in cover 24. Once cover 24 is snapped down, plug 12 is completed and ready for insertion into female adapter 14.

Figure 5:
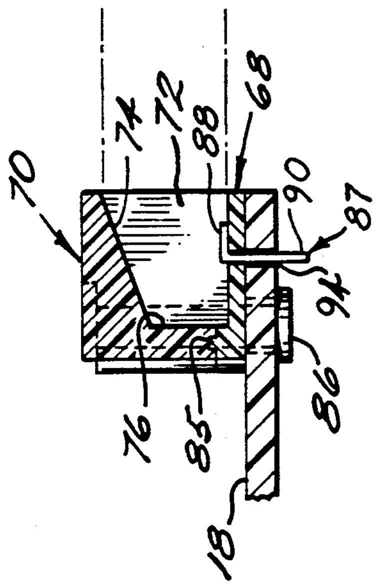
FIG. 5 is a cross-sectional elevation view along the line 5—5 of FIG. 2.

At this point, the electrical contacts 79 (which are preferably gold plated) of flex circuit 20 will lie immediately under resilient pressure applicator 37. Pressure applicator 37 may be comprised of any resilient type of material, however an open celled foam is preferred. Upon insertion of male plug 12 in female adapter 14, the force of compression of applicator 37 promotes contact between the electrical connector of flex circuit 20 and circuit board 18 which results in a more efficient wiping of the contacts. Once male plug 12 is completely inserted into female adapter 14, pressure applicator 37 aids in forcing the contacts of flex circuit 20 and board 18 together. Referring now to FIGS. 12–17, the components of female adapter 14 will be described. Adapter 14 comprises an optional, but preferred base plate 68 and a hood 70. Hood 70 comprises a generally rectangularly shaped housing having a cavity 72 with an open front and bottom surface. The upper interior surface 74 of cavity 72 has a sloped or ramped surface which is complimentary to the sloped surface 54 on cover section 24. Thus, the height of cavity 72 is largest at its front surface and is progressively smaller towards its rear surface 76 (see FIG. 5). As described earlier, a pair of openings 52 are positioned on opposed ends of cavity 72. Openings 52 are configured for snap-lock engagement with hooks 50 from cover 24. For this purpose, openings 52 include shoulders 78 for engagement with resilient hooks 50. Hood 70 also includes a pair of holes 80 in alignment with openings 52. Holes 80 pass completely through hood 70 and are sized to receive threaded fasteners 16 for attachment of hood 70 to circuit board (or other electronic device) 18. In addition, a pair of opposed alignment extensions 81 extend outwardly from the bottom surface of hood 70; and a longitudinal groove 83 extends along the length of the bottom surface of hood 70 for mating with a corresponding lip 85 on base plate 68.

Base plate 68 is rectangular in shape and essentially flat. Fastening holes 82 and alignment slots 84 are positioned on opposed ends of base plate 68. Fastening holes 82 correspond to holes 80 in hood 70. Alignment slots 84 correspond to extensions 81 found on hood 70. Upon attachment to circuit board 18, extensions 81 are aligned and mated with alignment slots 84. This arrangement provides proper alignment of fastening holes 82 and 80. Also, longitudinal lip 85 extends along the length of base plate 68 for mating with corresponding longitudinal groove 83 on hood 70. Once these holes are aligned, a screw or other fastening means 16 is dropped through the holes. Preferably, suitable threaded receivers 86 are provided in circuit board 18 to mate with threaded fasteners 16 so that hood 70 and base plate 68 become fastened to circuit board 18. In a preferred embodiment, receivers 86 comprise known press fit nuts.

Base plate 68 includes a slightly recessed upper surface 86 having a plurality of shaped electrical conductors 87 which are preferably gold plated and consist of a contact portion 88 and a pin portion 90. Pin 90 of conductor 87 extends outwardly from the bottom surface 92 of base plate 68. Pins 90 of conductors 87 are received in plated through-holes 94 in circuit board 18. Through-holes 94 may either mate with a circuit pattern 96 on the back side of circuit board 18; or alternatively may mate with a circuit pattern 98 located on the same surface of board 18 as base plate 68. In still another embodiment, circuit board 18 could comprise a multi-layer type circuit board with pins 90 of conductors 87 being connected to any one or more of the circuit layers in the multilayer circuit board. Pins 90 of conductors 87 are then soldered to through-holes 94. Contacts 88 of conductors 87 may have relatively close tolerances including 0.025 inch centers.

Figure 5A:
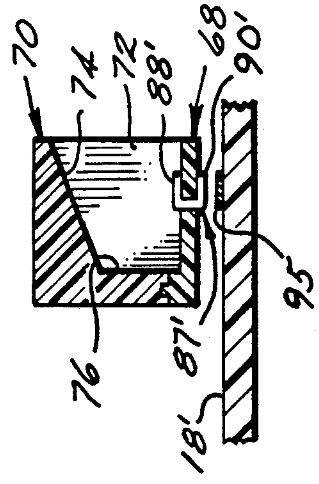
FIG. 5A is a cross-sectional elevation view similar to FIG. 5, depicting an alternative embodiment of the present invention.
Figure 6:
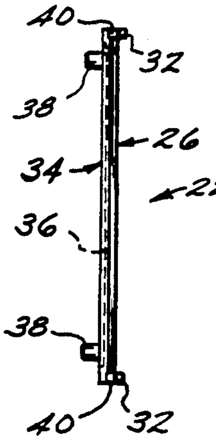
FIG. 6 is a front elevation view of the lower block portion of the male plug used in the connector of the present invention.
Figure 7:
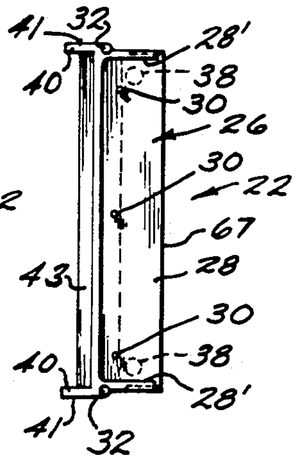
FIG. 7 is a top plan view of the lower block of FIG. 6.

Referring to FIG. 5A, another embodiment of the base plate 68 has a plurality of shaped electrical conductors 87' which are preferably gold plated and consist of a contact portion 88' and a pad portion 90'. Pad 90' of conductor 87' is formed to lie flat on the bottom surface 92 of base plate 68. Pads 90' of conductors 87' are in alignment with surface mount pads 95 on circuit board 18', and pads 90' of conductors 87' will electrically mate with surface mount pads 95 when the female adapter 14 is mechanically mounted and aligned with circuit board 18'. Pads 90' of conductors 87' can then be soldered to surface mount pads 95 of circuit board 18' in a manner typically known to those skilled in the art. It will be appreciated that the conductors 87' shown in this alternate embodiment could be formed such that pad portion 90' of conductor 87' could extend along bottom surface 92 of base plate 68 in any direction as long as surface mount pads 95 of circuit board 18' were in alignment with said pads 90'. This arrangement would allow varying manufacturing schemes for back plate 68 and conductors 87'.

Turning now to FIGS. 2 and 3, the plug-in connection sequence of the assembled connector 10 of the present invention is shown. This sequence involves grasping assembled male plug 12 and pushing the plug 12 into hood 70. A ramped portion in opening 52 (leading to shoulder 78) will automatically flex/compress arms 46 by engaging a ramped portion of hook 50. Further actuation pushes these ramped areas past one another allowing arm 46 to relax thereby engaging hook 50 onto shoulder 78. At this point, plug 12 will be mechanically fastened to hood 70. During this plug-in sequence, pads 79 on flexible circuit 20 will electrically mate with either corresponding pads 100 directly on circuit board 18; or on contacts 88 of conductors 87 on base plate 68 (see FIG. 1). Because of downward force applied by pressure pad 37 and the forward plug-in motion, relative wiping between the electrical contacts will occur. Of course, the connector 10 may be easily disassembled by reversing the above-noted assembly steps.

It will be appreciated that the connector assembly of the present invention may be used with or without base plate 68 with hood 70' being fastened directly to circuit board 18 as shown in the left-hand side of FIGS. 1-3. In this case, a backer plate 89 may be utilized (depending on the rigidity of circuit board 18) so that hood 70' and backer plate 89 sandwich circuit-board 18. Of course, if the circuit board has sufficient rigidity, no backer plate 89 is needed. This particular arrangement is useful when connecting a flexible circuit to circuit pattern 98 which terminates at circuit pads 100 on the same surface of the circuit board as hood 70'. In order to obtain requisite electrical contact, circuit pads 100 would be gold plated as is known in the art. In this embodiment, two additional holes 101 would be needed to receive extensions 81. It will be appreciated that in the event backer plate 89 is used, threaded receivers 86 are not needed as the threading is provided in openings 91 in backer plate 89.

However, the use of base plate 68 (as shown in the right-hand side of FIGS. 1-3) affords numerous advantages and comprises an important feature of the present invention. The provision of gold plated conductors 87 on base plate 68 allows circuit board 18 to be free of gold plating. This in turn, results in significant cost savings as it is far less expensive to gold plate the conductors 87 on base plate 68 than to gold plate the contacts on circuit board 18. Moreover, the several component parts are interchangeably configured so that changing from gold plated printed circuit board contacts to the soldered gold plated conductors 87 of base plate 68 only requires the addition of the molded base plate with integral conductors (i.e. all other component parts remain unchanged).

Still another feature of the present invention is the manner in which the flexible circuit 20 wraps about lower block 22 which thereby provides excellent strain relief for the flex circuit and assures precise registration and resistance to pull-out.

Significantly, each of the several component parts of connector 10 may be manufactured by either machining or preferably molding. In the latter case, only simple molding tools are required without the need for cams, sliders and other more complex tooling features. The component parts may be molded from any suitable thermoset of thermoplastic material depending upon the mechanical requirements of the part. Of course, all of the parts easily and quickly snap together to provide low cost and rapid assembly and disassembly.

It will be appreciated that the present invention, as described, allows for a flex-to-board connection that does not require a discrete fastener and can be mated and demated by hand without tools. The action of plugging male plug 12 into female adapter 14 on board 18 generates the necessary downward motion of the flex circuit contacts relative to the board contacts, and also produces the required amount of wipe.

This wiping effect is further enhanced by the ramping of hood 70 and cover 24, in conjunction with resilient pressure applicator 37. As the ramps mate, pressure is exerted on applicator 37 which exerts pressure on the electrical connectors forcing them to contact each other. This results in cleaning wiping action while plug 12 is dynamic, and a good electrical connection when plug 12 is static (e.g., held in place by hooks 50 and shoulders 78).

The electrical connector of the present invention has several important features and advantages, particularly when compared to known pin and socket connectors. For example, the connector of the present invention exhibits improved electrical performance (e.g., less discontinuity, less signal degradation, potentially higher signal speeds). The connector also employs a relatively simple construction leading to decreased manufacturing and assembly costs. Finally, the relatively small size and low profile of the connector reduces the space taken up on the surface of the circuit board.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical connector for connecting a flexible circuit to another circuit device comprising:

(1) male plug means, said male plug means including;
  (a) block means having opposed upper and lower surfaces, said block means also having alignment means for aligning a flexible circuit which has been wrapped about said upper and lower surfaces of said block means;
  (b) cover means attachable to said block means wherein a flexible circuit which has been wrapped about said block means will be sandwiched between said upper surface of said block means and said cover means, said cover means covering at least a portion of said upper surface of said block means with said lower surface of said block means being free of any coverage by said cover means; and
  (c) pressure applicator means associated with said lower surface of said block means wherein said pressure applicator means will be sandwiched between said block means and a flexible circuit which has been wrapped about said block means;
(2) female adapter means attachable to another electronic device, said female adapter means including a hood having a hood opening therethrough, said hood opening having a predetermined size to receive at least a portion of said male plug means therein; and
(3) detachable engagement means for effecting detachable engagement between said male plug means and said hood opening in said female adapter means;

and further including;

at least a pair of spaced tabs extending outwardly from a front edge of said block means;

at least a pair of spaced apertures through said cover means and in registration with said tabs, said apertures receiving said tabs when said cover means is attached to said block means; and snap-lock engagement means for snap-locking said cover means to said block means when said tabs are received in said apertures.

2. The connector of claim 1 wherein said snap-lock engagement means comprises:

a first pair of shoulders on opposed ends of said block means; and a second pair of shoulders on said cover means, said first and second pairs of shoulders respectively mating to effect a snap lock engagement between said block means and said cover means.

3. The connector of claim 1 including:

at least a pair of spaced pins extending from said upper surface of said block means, said pins being substantially transverse to said tabs; and at least a pair of spaced holes through said cover means and in registration with said pins, said holes receiving said pins when said cover means is attached to said block means.

4. The connector of claim 1 including;

a recess in said lower surface of said block means for retaining said pressure applicator means.

5. The connector of claim 1 including:

a depression in said upper surface of said block means for receiving and aligning an end of a flexible circuit which is t be wrapped about said block means.

6. The connector of claim 1 wherein:

said cover means of said male plug means has a sloping upper surface; and said hood opening has a sloping upper interior surface which is complimentary in configuration to said sloping upper surface of said cover means.

7. The connector of claim 1 including;

a flexible circuit attached to and wrapped about said block means, said flexible circuit being sandwiched between said block means and said cover means.

8. The connector of claim 1 wherein:

said pressure applicator means comprises a layer of resilient foam.

9. An electrical connector for connecting a flexible circuit to another circuit device comprising:

(1) male plug means, said male plug means including;

(a) block means having opposed upper and lower surfaces, said block means also having alignment means for aligning a flexible circuit which has been wrapped about said upper and lower surfaces of said block means;

(b) cover means attachable to said block means wherein a flexible circuit which has been wrapped about said block means will be sandwiched between said upper surface of said block means and said cover means, said cover means covering at least a portion of said upper surface of said block means with said lower surface of said block means being free of any coverage by said cover means; and (c) pressure applicator means associated with said lower surface of said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein; and (3) detachable engagement means for effecting detachable engagement between said male plug means and said hood opening in said female adapter means;

and further including;

at least a pair of spaced alignment posts extending outwardly from said lower surface of said bock means, said alignment posts aligning and engaging a flexible circuit which has been wrapped about said block means.

10. The connector of claim 9 including:

a flexible circuit attached to and wrapped about said block means, said flexible circuit being sandwiched between said block means and said cover means; and a pair of spaced openings through said flexible circuit for receiving and engaging said alignment posts.

11. An electrical connector for connecting a flexible circuit to another circuit device comprising:

(1) male plug means, said male plug means including;

(a) block means having opposed upper and lower surfaces, said block means also having alignment means for aligning a flexible circuit which has been wrapped about said upper and lower surfaces of said block means;

(b) cover means attachable to said block means wherein a flexible circuit which has been wrapped about said block means will be sandwiched between said upper surface of said block means and said cover means, said cover means covering at least a portion of said upper surface of said block means with said lower surface of said block means being free of any coverage by said cover means; and (c) pressure applicator means associated with said lower surface of said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein; and (3) detachable engagement means for effecting detachable engagement between said male plug means and said hood opening in said female adapter means;

and further including;

a depression in an upper surface of said block means for receiving and aligning an end of a flexible circuit which is to be wrapped about said block means;

a plurality of spaced attachment pins in said depressions for receiving and retaining an end of a flexible circuit which is to wrapped about said block means.

12. An electrical connector for connecting a flexible circuit to another circuit device comprising:

(1) male plug means, said male plug means including;

(a) block means having opposed upper and lower surfaces, said block means also having alignment means for aligning a flexible circuit which has been wrapped about said upper and lower surfaces of said block means;

(b) cover means attachable to said block means wherein a flexible circuit which has been wrapped about said block means will be sandwiched between said upper surface of said block means and said cover means, said cover means covering at least a portion of said upper surface of said block means with said lower surface of said block means being free of any coverage by said cover means; and (c) pressure applicator means associated with said lower surface of said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein; and (3) detachable engagement means for effecting detachable engagement between said male plug means and said hood opening in said female adapter means; and wherein said detachable engagement means comprises;

a pair of resilient U-shaped arms attached to opposed ends of said cover means, each of said arms terminating at a hook; and a pair of openings on opposed ends of said female adapter means, each of said openings including shoulder means for receiving and retaining one of said hooks in snap-locked engagement.

13. An electrical connector for connecting a flexible circuit to another circuit device comprising:

(1) male plug means, said male plug means including;

(a) block means having opposed upper and lower surfaces, said block means also having alignment means for aligning a flexible circuit which has been wrapped about said upper and lower surfaces of said block means;

(b) cover means attachable to said block means wherein a flexible circuit which has been wrapped about said block means will be sandwiched between said upper surface of said block means and said cover means, said cover means covering at least a portion of said upper surface of said block means with said lower surface of said block means being free of any coverage by said cover means; and (c) pressure applicator means associated with said lower surface of said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein; and (3) detachable engagement means for effecting detachable engagement between said male plug means and said hood opening in said female adapter means;

and further including;

spaced apertures through said hood for receiving mechanical fastener means.

14. An electrical connector for connecting a flexible circuit to another circuit device comprising:

(1) male plug means, said male plug means including;

(a) block means having opposed upper and lower surfaces, said block means also having alignment means for aligning a flexible circuit which has been wrapped about said upper and lower surfaces of said block means;

(b) cover means attachable to said block means wherein a flexible circuit which has been wrapped about said block means will be sandwiched between said upper surface of said block means and said cover means, said cover means covering at least a portion of said upper surface of said block means with said lower surface of said block means being free of any coverage by said cover means; and (c) pressure applicator means associated with said lower surface of said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein; and (3) detachable engagement means for effecting detachable engagement between said male plug means and said hood opening in said female adapter means;

and further including;

base plate means having opposed upper and lower planar surfaces, said base plate means communicating with a lower surface of said hood opening, said base plate means including a plurality of spaced conductors on said upper surface such that said conductors reside in said hood opening, said conductors including a contact portion exposed in said hood opening and a pin portion through said plate means, said pin portion extending outwardly of said lower surface of said base plate means; and spaced apertures through said hood and through said base plate means for receiving mechanical fastener means.

15. The connector of claim 1 including:

base plate means having opposed upper and lower planar surfaces, said base plate means communicating with a lower surface of said hood opening, said base plate means including a plurality of spaced conductors on said upper surface such that said conductors reside in said hood opening, said conductors including a contact portion exposed in said hood opening and a pin portion through said plate means, said pin portion extending outwardly of said lower surface of said base plate means.

16. The connector of claim 15 including:

a lip extending along said upper surface of said plate means; and a groove in a lower surface of said hood wherein said lip and groove mate to align said hood to said base plate means.

17. The connector of claim 15 wherein:

said conductors include a layer of gold.

18. The connector of claim 15 wherein said female adapter is attached to a circuit board, said circuit board including a plurality of through-holes associated with a circuit pattern and wherein:

said pins extending from said base plate means are mechanically and electrically attached to said through-holes.

19. An electrical connector for connecting a flexible circuit to another circuit device comprising:

(1) male plug means, said male plug means including;

(a) block means having opposed upper and lower surfaces, said block means also having alignment means for aligning a flexible circuit which has been wrapped about said upper and lower surfaces of said block means;

(b) cover means attachable to said block means wherein a flexible circuit which has been wrapped about said block means will be sandwiched between said upper surface of said block means and said cover means, said cover means covering at least a portion of said upper surface of said block means with said lower surface of said block means being free of any coverage by said cover means; and (c) pressure applicator means associated with said lower surface of said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein; and (3) detachable engagement means for effecting detachable engagement between said male plug means and said hood opening in said female adapter means; and further including;

base plate means having opposed upper and lower planar surfaces, said base plate means communicating with a lower surface of said hood opening, said base plate means including a plurality of spaced conductors on said upper surface such that said conductors reside in said hood opening said conductors comprising a contact portion exposed in said hood opening and a pin portion through said plate means, said pin portion terminating at a surface mountable pad on said lower surface of said base plate means; and spaced apertures through said hood and through said base plate means for receiving mechanical fastener means.

20. The connector of claim 1 including:

base plate means having opposed upper and lower planar surfaces, said base plate means communicating with a lower surface of said hood opening, said base plate means including a plurality of spaced conductors on said upper surface such that said conductors reside in said hood opening, said conductors comprising a contact portion exposed in said hood opening and a pin portion through said plate means, said pin portion terminating at a surface mountable pad on said lower surface of said base plate means.

21. The connector of claim 20 including:

a lip extending along said upper surface of said plate means; and a groove in a lower surface of said hood wherein said lip and groove mate to align said hood to said base plate means.

22. The connector of claim 20 wherein:

said conductors include a layer of gold.

23. The connector of claim 20 wherein said female adapter is attached to a circuit board, said circuit board including a plurality of surface mount pads associated with a circuit pattern and wherein:

said surface mountable pads of said pin portions are mechanically and electrically attached to said surface mount pads of said circuit pattern.

24. An electrical connector for connecting a flexible circuit to another circuit device comprising:

(1) male plug means, said male plug means including;

(a) block means having alignment means for aligning a flexible circuit which has been wrapped about said block means;

(b) cover means attachable to said block means wherein a flexible circuit which has been wrapped about said block means will be sandwiched between said block means and said cover means; and (c) pressure applicator means associated with said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein;

(3) detachable engagement means for effecting detachable engagement between said male plug means and said hood opening in said female adapter means;

at least a pair of spaced tabs extending outwardly from a front edge of said block means;

at least a pair of spaced apertures through said cover means and in registration with said tabs, said apertures receiving said tabs when said cover means is attached to said block means; and snap-lock engagement means for snap-locking said cover means to said block means when said tabs are received in said apertures.

25. The connector of claim 24 wherein said snap-lock engagement means comprises:

a first pair of shoulders on opposed ends of said block means; and a second pair of shoulders on said cover means, said first and second pairs of shoulders respectively mating to effect a snap lock engagement between said block means and said cover means.

26. The connector of claim 24 including:

at least a pair of spaced pins extending from an upper surface of said block means, said pins being substantially transverse to said tabs; and at least a pair of spaced holes through said cover means and in registration with said pins, said holes receiving said pins when said cover means is attached to said block means.

27. An electrical connector for connecting a flexible circuit to another circuit device comprising:

(1) male plug means, said male plug means including;

(a) block means having alignment means for aligning a flexible circuit which has been wrapped about said block means;

(b) cover means attachable to said block means wherein a flexible circuit which has been wrapped about said block means will be sandwiched between said block means and said cover means; and (c) pressure applicator means associated with said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein; and (3) detachable engagement means for effecting detachable engagement between said male plug means and said hood opening in said female adapter means;

a depression in an upper surface of said block means for receiving and aligning an end of a flexible circuit which is to be wrapped about said block means; and a plurality of spaced attachment pins in said depression for receiving and retaining an end of a flexible circuit which is to be wrapped about said block means.

28. An electrical connector for connecting a flexible circuit to another circuit device comprising:

(1) male plug means, said male plug means including;

(a) block means having alignment means for aligning a flexible circuit which has been wrapped about said block means;

(b) cover means attachable to said block means wherein a flexible circuit which has been wrapped about said block means will be sandwiched between said block means and said cover means; and (c) pressure applicator means associated with said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein;

(3) detachable engagement means for effecting detachable engagement between said male plug means and said hood opening in said female adapter means, wherein said detachable engagement means comprises;

a pair of resilient u-shaped arms attached to opposed ends of said cover means, each of said arms terminating at a hook; and a pair of openings on opposed ends of said female adapter means, each of said openings including shoulder means for receiving and retaining one of said hooks in snap-locked engagement.

29. An electrical connector for connecting a flexible circuit to another circuit device comprising:

(1) male plug means, said male plug means including;

(a) block means having alignment means for aligning a flexible circuit which has been wrapped about said block means;

(b) cover means attachable to said block means wherein a flexible circuit which has been wrapped about said block means will be sandwiched between said block means and said cover means; and (c) pressure applicator means associated with said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein;

(3) detachable engagement means for effecting detachable engagement between said male plug means and said hood opening in said female adapter means;

wherein said cover means is attachable to said block means by snap-lock engagement means which snap-lock said cover means to said block means, said snap-lock engagement means comprising;

a first pair of shoulders on opposed ends of said block means; and a second pair of shoulders on said cover means, said first and second pairs of shoulders respectively mating to effect a snap lock engagement between said block means and said cover means.

30. An electrical connector for connecting a flexible circuit to another circuit device comprising:

(1) male plug means, said male plug means including;

(a) block means having alignment means for aligning a flexible circuit which has been wrapped about said block means;

(b) cover means attachable to said block means wherein a flexible circuit which has been wrapped about said block means will be sandwiched between said block means and said cover means; and (c) pressure applicator means associated with said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein, said hood having an upper wall and two opposed depending side walls defining therebetween said hood opening;

(3) detachable engagement means for effecting detachable engagement between said male plug means and said hood opening in said female adapter means; and base plate means having a flat configuration with opposed upper and lower planar surfaces, said base plate means being a discrete and separable piece from said hood, said base plate means communicating with the side walls of said hood to define a lower wall for said hood, said base plate means including a plurality of spaced conductors on said upper surface such that said conductors reside in said hood opening, said conductors including a contact portion exposed in said hood opening and a pin portion through said plate means, said pin portion extending outwardly of said lower surface of said base plate means; and spaced apertures through said hood and through said base plate means for receiving mechanical fastener means.

31. The connector of claim 30 including:

a lip extending along said upper surface of said plate means; and a groove in a lower surface of said hood wherein said lip and groove mate to align said hood to said base plate means.

32. The connector of claim 30 wherein:

said conductors include a layer of gold.

33. The connector of claim 30 wherein said female adapter is attached to a circuit board, said circuit board including a plurality of through-holes associated with a circuit pattern and wherein:

said pins extending from said base plate means are mechanically and electrically attached to said through-holes.

34. An electrical connector for connecting a flexible circuit to another circuit device comprising:

(1) male plug means, said male plug means including;

(a) block means having alignment means for aligning a flexible circuit which has been wrapped about said block means;

(b) cover means attachable to said block means wherein a flexible circuit which has been wrapped about said block means will be sandwiched between said block means and said cover means; and (c) pressure applicator means associated with said block means wherein said pressure applicator means will be sandwiched between said block means and a flexible circuit which has been wrapped about said block means;

(2) female adapter means attachable to another electronic device, said female adapter means including a hood having a hood opening therethrough, said hood opening having a predetermined size to receive at least a portion of said male plug means therein, said hood having an upper wall and two opposed depending side walls defining therebetween said hood opening;

(3) detachable engagement means for effecting detachable engagement between said male plug means and said hood opening in said female adapter means; and base plate means having a flat configuration with opposed upper and lower planar surfaces, said base plate means being a discrete and separable piece from said hood, said base plate means communicating with the side walls of said hood to define a lower wall for said hood, said base plate means including a plurality of spaced conductors on said upper surface such that said conductors reside in said hood opening, said conductors including a contact portion exposed in said hood opening and a pin portion through said plate means, said pin portion terminating at a surface mountable pad on said lower surface of said base plate means; and spaced apertures through said hood and through said base plate means for receiving mechanical fastener means.

35. The connector of claim 34 including:

a lip extending along said upper surface of said plate means; and a groove in a lower surface of said hood wherein said lip and groove mate to align said hood to said base plate means.

36. The connector of claim 34 wherein:

said conductors include a layer of gold.

37. The connector of claim 34 wherein said female adapter is attached to a circuit board, said circuit board including a plurality of surface mount pads associated with a circuit pattern and wherein:

said surface mountable pads of said pin portions are mechanically and electrically attached to said surface mount pads of said circuit pattern.

* * * * *